(12) United States Patent
Chung et al.

(10) Patent No.: US 9,072,178 B2
(45) Date of Patent: Jun. 30, 2015

(54) STACKED-TYPE MULTILAYER CERAMIC ELECTRONIC COMPONENT, STACKED-TYPE MULTILAYER CERAMIC ELECTRONIC COMPONENT MODULE, AND METHOD OF MANUFACTURING THE SAME

(71) Applicant: SAMSUNG ELECTRO-MECHANICS CO., LTD., Suwon, Gyunggi-do (KR)

(72) Inventors: Hae Sock Chung, Gyunggi-do (KR); Doo Young Kim, Gyunggi-do (KR); Na Rim Ha, Gyunggi-do (KR); Youn Sik Jin, Gyunggi-do (KR); Tae Ok Kim, Gyunggi-do (KR)

(73) Assignee: SAMSUNG ELECTRO-MECHANICS CO., LTD., Suwon, Gyunggi-Do (KR)

( * ) Notice: Subject to any disclaimer, the term of this patent is extended or adjusted under 35 U.S.C. 154(b) by 174 days.

(21) Appl. No.: 13/842,121

(22) Filed: Mar. 15, 2013

(65) Prior Publication Data
US 2014/0160622 A1    Jun. 12, 2014

(30) Foreign Application Priority Data

Dec. 10, 2012  (KR) .......................... 10-2012-0142918

(51) Int. Cl.
| | |
|---|---|
| *H01G 4/228* | (2006.01) |
| *H05K 1/02* | (2006.01) |
| *H01G 4/12* | (2006.01) |
| *H05K 1/18* | (2006.01) |
| *H01G 4/30* | (2006.01) |
| *H01G 4/38* | (2006.01) |

(52) U.S. Cl.
CPC ............... *H05K 1/0231* (2013.01); *H01G 4/12* (2013.01); *H05K 1/181* (2013.01); *Y10T 29/43* (2015.01); *H01G 4/30* (2013.01); *H01G 4/38* (2013.01); *H01G 4/228* (2013.01)

(58) Field of Classification Search
CPC ........... H01G 4/30; H01G 4/12; H01G 4/005; H01G 4/248; H01G 4/2325; H01G 2/065
USPC ..................... 361/306.3, 301.2, 301.4, 306.1, 361/303–305, 321.1, 321.2
See application file for complete search history.

(56) References Cited

U.S. PATENT DOCUMENTS

| | | | |
|---|---|---|---|
| 6,433,992 B2 * | 8/2002 | Nakagawa et al. ......... | 361/301.4 |
| 6,958,899 B2 * | 10/2005 | Togashi et al. ............. | 361/303 |

FOREIGN PATENT DOCUMENTS

KR    2005-0093878 A    9/2005

* cited by examiner

*Primary Examiner* — Nguyen T Ha
(74) *Attorney, Agent, or Firm* — McDermott Will & Emery LLP

(57) ABSTRACT

There is provided a stacked-type multilayer ceramic electronic component including: a ceramic body, a plurality of first and second internal, and first and second external electrodes formed on both surfaces of the ceramic element opposing one another; and first and second metal frames disposed to face one another and allowing the first and second external electrodes of the ceramic body to be attached thereto, respectively, wherein two or more ceramic bodies are attached between the first and second metal frames in a length direction of the first and second metal frames with an interval therebetween, and the respective ceramic bodies have different levels of capacitance.

15 Claims, 5 Drawing Sheets

A-A'

STACKED-TYPE MULTILAYER CERAMIC ELECTRONIC COMPONENT, STACKED-TYPE MULTILAYER CERAMIC ELECTRONIC COMPONENT MODULE, AND METHOD OF MANUFACTURING THE SAME

CROSS-REFERENCE TO RELATED APPLICATIONS

This application claims the priority of Korean Patent Application No. 10-2012-142918 filed on Dec. 10, 2012, in the Korean Intellectual Property Office, the disclosure of which is incorporated herein by reference.

BACKGROUND OF THE INVENTION

1. Field of the Invention

The present invention relates to a stacked-type multilayer ceramic electronic component, a stacked-type multilayer ceramic electronic component module, and a method of manufacturing the same.

2. Description of the Related Art

Electronic components containing a ceramic material include a capacitor, an inductor, a piezoelectric element, a varistor, a thermistor, and the like.

Among ceramic electronic components, a multilayer ceramic capacitor (MLCC) is an electronic component having advantages such as compactness, guaranteed high capacity, and ease of mountability.

An MLCC is a chip-type condenser installed on a circuit board of various electronic products such as imaging devices (or video apparatuses) such as liquid crystal displays (LCDs), plasma display panels (PDPs), and the like, computers, personal digital assistants (PDAs), portable phones, and the like, to charge or discharge electricity.

When an MLCC is mounted on a printed circuit board (PCB), it is thermally/mechanically deformed when stress resulting from expansion and contraction and mechanical deformation of the PCB due to a change in a temperature is exerted thereon.

In detail, when an MLCC is mounted on a PCB, a temperature may be increased up to about 260 and then decreased, and at this time, solder and an electrode pad of the PCB contract to generate tensile stress and the board contracts to generate compressive stress. Thus, interaction of the tensile stress and compressive stress may cause cracks in the MLCC.

Also, barium titanate ($BaTiO_3$)-based ceramic powder is generally used as a material of a high-K dielectric chip component, and here, the barium titanate ($BaTiO_3$)-based ceramic powder has a perovskite structure and has a crystal structure changing according to a temperature.

In particular, in the case that a field is applied in a tetragonal structure, lattices may be severely deformed according to a field direction, and in case that an MLCC is mounted on a PCB by stiff soldering, the MLCC vibrates vertically according to a field of an alternating current (AC) voltage and mechanical vibrations are transferred to the PCB to generate noise known as acoustic noise.

In order to solve the problem of cracks and acoustic noise, a method of mounting an electronic component such that the electronic component is spaced apart from the PCB upwardly thereof by using a metal frame has been presented.

However, in the case of mounting an electronic component such that it is spaced apart from the PCB upwardly thereof by using a metal frame, parasitic inductance equivalent to the distance from the PCB is increased in a current loop, in comparison to the method of directly mounting an electronic component on the PCB.

The increase in the parasitic inductance may increase fluctuations in voltages supplied from power, potentially causing an active element of a circuit to malfunction Thus, in order to reduce a voltage fluctuation range, an MLCC having low parasitic inductance is required to be used or current consumption of a circuit per unit time is required to be reduced.

However, recently, electronic devices have tended to consume a great amount of power, so above all, it is important to regulate parasitic inductance to be as low as possible.

Related art document 1 below relates to a stacked-type MLCC, but without disclosing an issue regarding a difference between capacitance and inductance values of upper and lower capacitors.

RELATED ART DOCUMENT (Patent document 1) Korean Patent Laid Open Publication No. 10-2005-0093878

SUMMARY OF THE INVENTION

A new scheme that may be able to cancel out an increase in parasitic inductance, while restraining cracks and vibrations (acoustic noise) in a stacked-type multilayer ceramic electronic component in mounting the component on a printed circuit board (PCB) is required.

According to an aspect of the present invention, there is provided a stacked-type multilayer ceramic electronic component including: a ceramic body including a ceramic element in which a plurality of dielectric layers are laminated, a plurality of first and second internal electrodes formed on one surfaces of the dielectric layers and alternately exposed to both surfaces of the ceramic element opposing one another in a lamination direction of the dielectric layers, and first and second external electrodes formed on both surfaces of the ceramic element opposing one another and electrically connected to exposed portions of the first and second internal electrodes; and first and second metal frames disposed to face one another and allowing the first and second external electrodes of the ceramic body to be attached thereto, respectively, wherein two or more ceramic bodies are attached between the first and second metal frames in a length direction of the first and second metal frames with an interval therebetween, and the respective ceramic bodies have different levels of capacitance.

Two ceramic bodies may be provided, first and second internal electrodes of the respective ceramic bodies may alternately be exposed to both end surfaces of the ceramic bodies, first and second external electrodes may be formed on both end surfaces of the ceramic bodies, respectively, and the first and second metal frames may be disposed to contact both end surfaces of the respective ceramic bodies.

The first and second metal frames may be formed as flat plate type frames in parallel, such that external electrode adhesion surfaces thereof face one another.

Two first and second ceramic bodies may be provided, first and second internal electrodes of the first ceramic body may alternately be exposed to both end surfaces of the ceramic element and first and second external electrodes of the first ceramic body may be formed on both end surfaces of the ceramic element, first and second internal electrodes of the second ceramic body may alternately be exposed to both lateral surfaces of the ceramic element and first and second external electrodes of the second ceramic body may be formed on both lateral surfaces of the ceramic element, the first and second ceramic bodies may be attached between the first and second metal frames with an interval therebetween such that directions in which the first and second external electrodes of the respective first and second ceramic bodies are formed may intersect vertically, and the first and second metal frames may be disposed in corner portions of the first and second ceramic bodies opposing diagonally.

External electrode adhesion surfaces of the first and second metal frames may include a first unit frame connected to the vertically intersecting first and second external electrodes of the first and second ceramic bodies and having a flat surface in a length direction of the first ceramic body, and a second unit frame connected to the first unit frame and having a flat surface in a width direction of the first ceramic body, respectively.

According to another aspect of the present invention, there is provided a stacked-type multilayer ceramic electronic component module including: a printed circuit board (PCB) having first and second electrode pads formed on an upper surface thereof; first and second metal frames installed on the first and second electrode pads and electrically connected thereto, respectively; and two or more ceramic bodies are attached between the first and second metal frames in a length direction of the first and second metal frames with an interval therebetween, wherein each of the ceramic bodies includes a ceramic element in which a plurality of dielectric layers are laminated, a plurality of first and second internal electrodes formed on one surfaces of the dielectric layers and alternately exposed to both surfaces of the ceramic element in a lamination direction of the dielectric layers, and first and second external electrodes formed on both surfaces of the ceramic element opposing one another, electrically connected to exposed portions of the first and second internal electrodes, and attached to the first and second metal frames, respectively, wherein the respective ceramic bodies have different levels of capacitance.

Connection terminal plates may be provided on lower ends of the first and second metal frames in order to extend surface in contact with the first and second electrode pads.

An inductance value of a ceramic body positioned to be close to the PCB may be lower than an inductance value of a ceramic body positioned to be distant from the PCB.

According to another aspect of the present invention, there is provided a method for manufacturing a stacked-type multilayer ceramic electronic component module, including: preparing a plurality of ceramic elements having a plurality of dielectric layers and a plurality of internal electrodes alternately exposed to both end surfaces thereof opposing one another, the ceramic elements having different amounts of laminated internal electrodes to have different levels of capacitance; forming first and second external electrodes electrically connected to the exposed portions of the internal electrodes on both end surfaces of the respective ceramic elements to prepare a plurality of ceramic bodies; disposing first and second flat plate type metal frames such that they face one another in parallel, disposing the plurality of ceramic bodies between the first and second metal frames in a length direction of the first and second metal frames with an interval therebetween, and subsequently attaching the first and second external electrodes of the ceramic bodies to the first and second metal frames to fabricate stacked-type multilayer ceramic electronic components; and attaching lower end portions of the first and second metal frames to first and second electrode pads provided on a PCB by solders so as to be electrically connected thereto.

According to another aspect of the present invention, there is provided a method for manufacturing a stacked-type multilayer ceramic electronic component module, including: preparing a first ceramic element having a plurality of dielectric layers and a plurality of internal electrodes alternately exposed to both end surfaces thereof opposing one another and a second ceramic element having a plurality of dielectric layers and a plurality of internal electrodes alternately exposed to both lateral surfaces thereof opposing one another, the first and second ceramic elements having different amounts of laminated internal electrodes to have different levels of capacitance; forming first and second external electrodes electrically connected to the exposed portions of the internal electrodes on both end surfaces of the first ceramic element and forming first and second external electrodes electrically connected to the exposed portions of the internal electrodes on both lateral surfaces of the second ceramic element to prepare first and second ceramic bodies; disposing first and second metal frames formed to be bent to have an 'L' shape such that they face one another diagonally, disposing the first and second ceramic bodies between the first and second metal frames in a length direction of the first and second metal frames with an interval therebetween, and subsequently attaching diagonally opposing portions of the first and second external electrodes of the first and second ceramic bodies to the bent portions of the first and second metal frames to fabricate stacked-type multilayer ceramic electronic components; and attaching lower end portions of the first and second metal frames to first and second electrode pads provided on a PCB by solders so as to be electrically connected thereto.

In the electrically connecting of the first and second metal frames to the PCB, a direction in which the stacked-type multilayer ceramic electronic components are attached to the PCB may be set such that the second ceramic body is positioned to be closer to the PCB.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
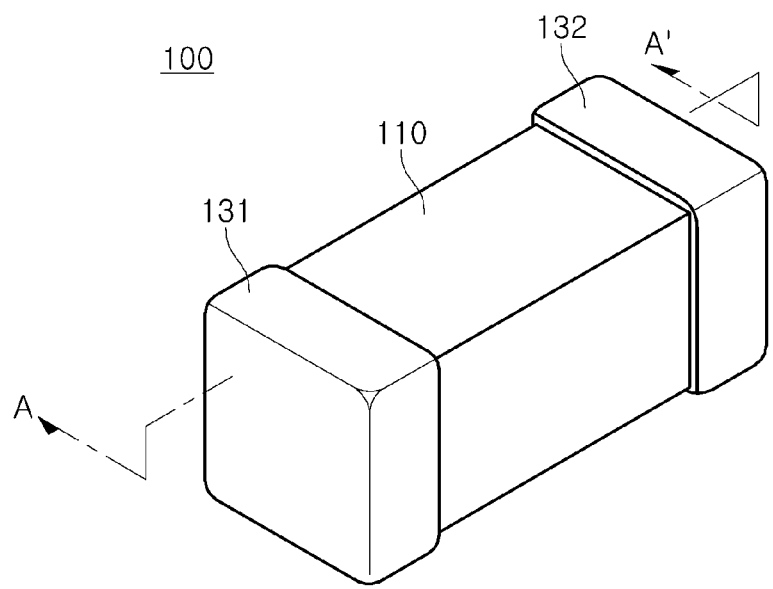
FIG. 1 is a perspective view illustrating a schematic structure of a single multilayer ceramic capacitor (MLCC) as a multilayer ceramic electronic component applied to the present invention.

Embodiments of the present invention will now be described in detail with reference to the accompanying drawings.

The invention may, however, be embodied in many different forms and should not be construed as being limited to the embodiments set forth herein.

Rather, these embodiments are provided so that this disclosure will be thorough and complete, and will fully convey the scope of the invention to those skilled in the art.

In the drawings, the shapes and dimensions of elements may be exaggerated for clarity, and the same reference numerals will be used throughout to designate the same or like components.

The present invention relates to a ceramic electronic component, and the ceramic electronic component according to an embodiment of the present invention may include a multilayer ceramic capacitor (MLCC), an inductor, a piezoelectric element, a varistor, a chip resistor, a thermistor, and the like. Hereinafter, an MLCC will be described as an example of a ceramic electronic product.

Also, for the purposes of description, in the present embodiment, it is defined that surfaces on which first and second external electrodes of a first ceramic body are formed are left and right end surfaces, surfaces on which first and second external electrodes of a second ceramic body are formed are left and right lateral surfaces, and a direction in which the first and second ceramic bodies are disposed in a vertical direction with an interval therebetween.

Figure 2:
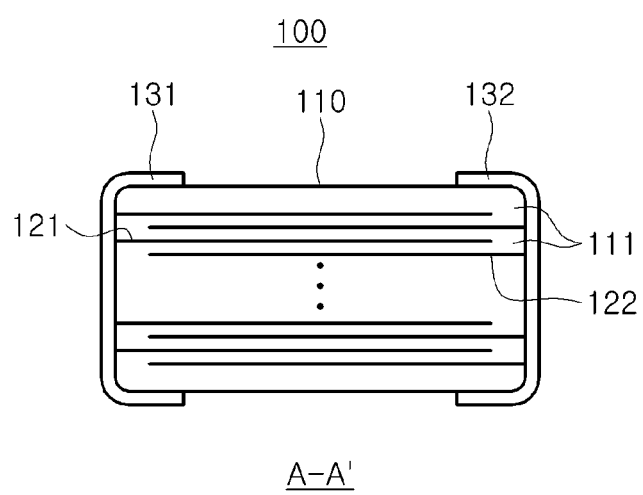
FIG. 2 is a cross-sectional view taken along line A-A' in FIG. 1.
Figure 3:
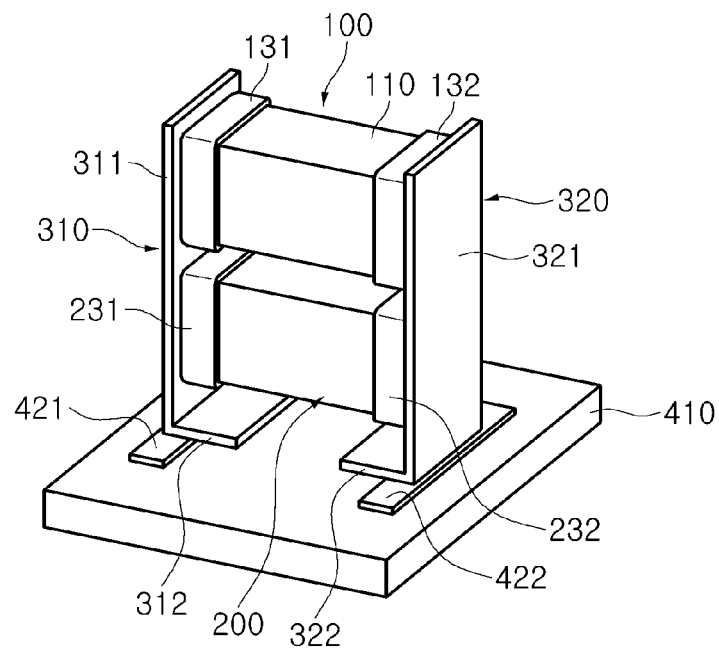
FIG. 3 is a perspective view illustrating a schematic structure of a stacked-type MLCC module according to an embodiment of the present invention.

Referring to FIGS. 1 through 3, a stacked-type MLCC according to the present embodiment include two ceramic bodies 100 and 200 having different levels of capacitance, and first and second metal frames 310 and 320 supporting the two ceramic bodies 100 and 200 at a predetermined interval.

The first and second metal frames 310 and 320 are disposed to face each other, and the respective ceramic bodies 100 and 200 are attached at a predetermined interval in a vertical length direction between the first and second metal frames 310 and 320.

The upper ceramic body 100 may include a ceramic element 110 in which a plurality of dielectric layers 111 are laminated, a plurality of first and second internal electrodes 121 and 122 formed on at least one surface of each of the dielectric layer 111 and alternately exposed to both end surfaces of the ceramic element 110 in a lamination direction of the dielectric layers 111 and first and second external electrodes 131 and 132 formed on both end surfaces of the ceramic element 110 and electrically connected to exposed portions of the first and second internal electrodes 121 and 122.

The ceramic element 110 may be formed by laminating the plurality of dielectric layers 111 and firing the same. Here, the plurality of dielectric layers 111 constituting the ceramic element 110 are in a sintered state and adjacent dielectric layers 111 are integrated such that boundaries therebetween may not be readily apparent. The ceramic element 110 may generally have a rectangular parallelepiped shape, but there is no particular limitation on the shape of the ceramic element 110 and the present invention is not limited thereto.

The dielectric layers 111 are a part contributing to formation of capacitance of the capacitor, and a thickness of one layer may be arbitrarily changed according to a design of capacitance of the MLCC 100. The dielectric layers 111 constituting the ceramic element 110 may be made of a ceramic material having high K dielectric (or a high dielectric constant), e.g., barium titanate ($BaTiO_3$)-based ceramic powder.

The barium titanate ($BaTiO_3$)-based ceramic powder may include $(Ba_{1-x}Ca_x)TiO_3$, $Ba(Ti_{1-y}Ca_y)O_3$, $(Ba_{1-x}Ca_x)(Ti_{1-y}Zr_y)O_3$, $Ba(Ti_{1-y}Zr_y)O_3$, and the like, obtained by partially employing calcium (Ca), zirconium (Zr), or the like, in $BaTiO_3$, but the present invention is not limited thereto.

Also, if necessary, various ceramic additives such as a transition metal oxide or carbide, a rare earth element, magnesium (Mg), aluminum (Al), or the like, an organic solvent, a plasticizer, a binder, a dispersing agent, and the like, may be added to the dielectric layers 111.

The first and second internal electrodes 121 and 122 may be formed on ceramic sheets forming the dielectric layers 111, laminated, and subsequently fired so as to be formed with one dielectric layer 111 interposed therebetween with the ceramic element 110.

The first and second internal electrodes 121 and 122 may be formed by printing a conductive paste having a predetermined thickness on at least one surface of the dielectric layer 111. In order to print the conductive paste, a screen printing method, a gravure printing method, or the like, may be used and the present invention is not limited thereto.

The first and second internal electrodes 121 and 122 are a pair of electrodes having different polarities. The first and second internal electrodes 121 and 122 may be disposed to face each other in a lamination direction of the dielectric layers 111 and electrically insulated by the dielectric layer 111 disposed therebetween.

In the present embodiment, one ends of the first and second internal electrodes 121 and 122 may alternately be exposed to one end surface of the ceramic element 110, and the exposed one ends of the first and second internal electrodes 121 and 122 may be electrically connected to the first and second external electrodes 131 and 132.

Thus, when a predetermined voltage is applied to the first and second external electrodes 131 and 132, charges are accumulated between the first and second internal electrodes 121 and 122 facing one another, and here, capacitance of the MLCC 100 is proportional to an area of the overlap region of the first and second internal electrodes 121 and 122.

The first and second external electrodes 131 and 132 may be made of a conductive paste including a conductive metal. The conductive metal may be nickel (Ni), copper (Cu), palladium (Pd), gold (Au), or an alloy thereof and the present invention is not limited thereto.

Meanwhile, the lower ceramic body 200 has a structure similar to that of the upper ceramic body 100 and is different from the upper ceramic body 100, in that a lamination amount of the first and second internal electrodes is differentiated to have a different area of overlap regions from the first and second internal electrodes to have capacitance different from that of the upper ceramic body 100.

The first and second metal frames 310 and 320 may be formed as flat plate type frames such that external electrode adhesion surfaces 311 and 321 face each other in parallel. First and second external electrodes 231 and 232 of the lower ceramic body 200 and first and second external electrodes 131 and 132 of the upper ceramic body 100 may be sequentially attached at intervals from below to the external electrode adhesion surfaces 311 and 321.

Here, connection terminal plates 312 and 322 may be formed to be bent by 90° inwardly on lower end portions of the first and second metal frames 310 and 320 in order to increase a surface in contact with first and second electrode pads 421 and 422 of a printed circuit board (PCB) as described hereinafter, to enhance reliability of electrical connection.

The stacked-type MLCC may be mounted on a PCB 410.

The first and second electrode pads 421 and 422 may be formed on portions of an upper surface of the PCB 410 corresponding to circuit patterns (not shown), and the connection terminal plates 312 and 322 may be attached to the first and second electrode pads 421 and 422 by solders (not shown) so as to be electrically connected.

Figure 4:
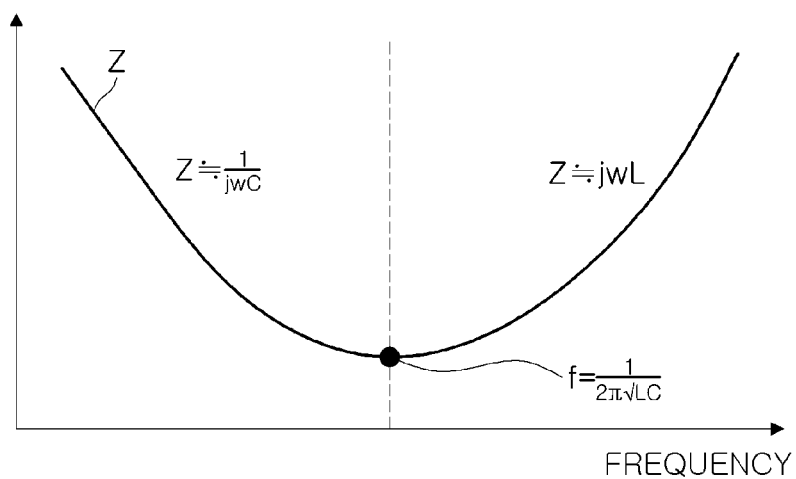
FIG. 4 is a graph showing a general relationship between impedance and frequency.

FIG. 4 is a graph showing a general relationship between impedance and frequency.

Referring to FIG. 4, a resonance frequency may be represented by a function of capacitance (C) and L (ESL). A resonance frequency is decreased as L (ESL) and C (capacitance) are increased, and increased as L (ESL) and C (capacitance) are decreased.

In the present embodiment, when the MLCCs are connected in parallel vertically by the first and second meal frames, the sum of impedance curves appear as an overall impedance curve of the MLCCs connected in parallel, and in this case, the overall impedance curve may be adjusted by adjusting C (capacitance) and ESL.

Figure 5A:
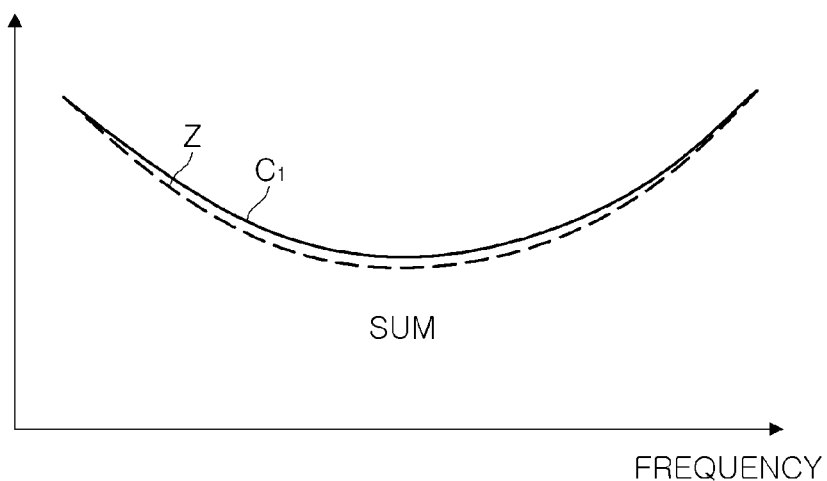
FIG. 5A is a graph showing a relationship between frequency and impedance in a structure in which a single ceramic body is mounted on a printed circuit board (PCB) according to the related art.
Figure 5B:
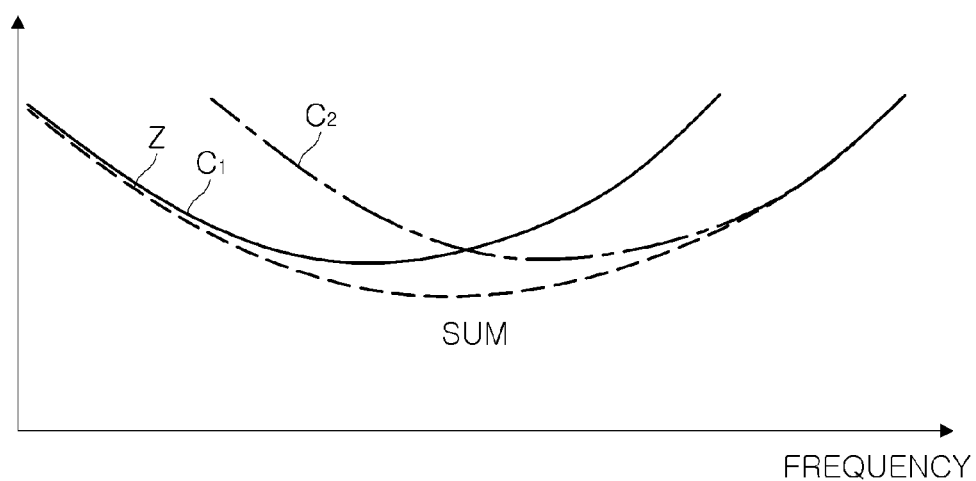
FIG. 5B is a graph showing a relationship between frequency and impedance in a structure in which two ceramic bodies are mounted to be vertically parallel on a PCB and capacitance of a lower ceramic body is greater than capacitance of an upper ceramic body according to an embodiment of the present invention.
Figure 5C:
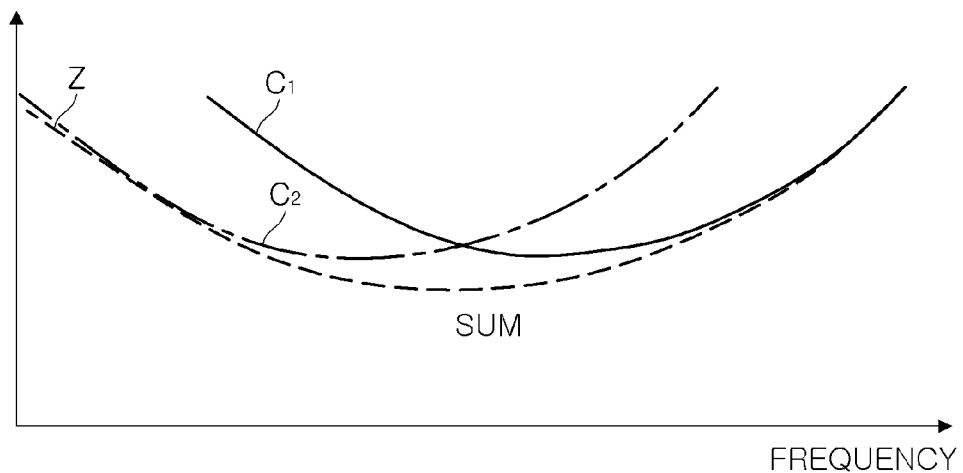
FIG. 5C is a graph showing a relationship between frequency and impedance in a structure in which two ceramic bodies are mounted to be vertically parallel on a PCB and capacitance of a lower ceramic body is lower than capacitance of an upper ceramic body according to an embodiment of the present invention.

FIG. 5A is a graph showing a relationship between frequency and impedance in a structure in which a single ceramic body is mounted on a printed circuit board (PCB) according to the related art. FIG. 5B is a graph showing a relationship between frequency and impedance in a structure in which two ceramic bodies are mounted to be vertically parallel on a PCB and capacitance of a lower ceramic body is greater than capacitance of an upper ceramic body according to an embodiment of the present invention. FIG. 5C is a graph showing a relationship between frequency and impedance in a structure in which two ceramic bodies are mounted to be vertically parallel on a PCB and capacitance of a lower ceramic body is lower than capacitance of an upper ceramic body according to an embodiment of the present invention;

In the related art example, when two ceramic bodies are connected in parallel vertically and the ceramic bodes are configured to have the same capacitance (C), overall impedance is lowered.

Referring to FIGS. 5B and 5C, in comparison to the case in which a single ceramic body is mounted with first and second metal frames and a case in which two ceramic bodies are connected in parallel and the respective ceramic bodies are configured to have the same capacitance, when two ceramic bodies are connected in parallel and the respective ceramic bodies are configured to have different levels of capacitance (C), impedance can be controlled within a broader frequency range, obtaining an effect of canceling out an increase in parasitic inductance, while restraining an occurrence of cracks and vibrations (acoustic noise) when a voltage is applied after the MLCCs are mounted on the PCB.

Figure 6:
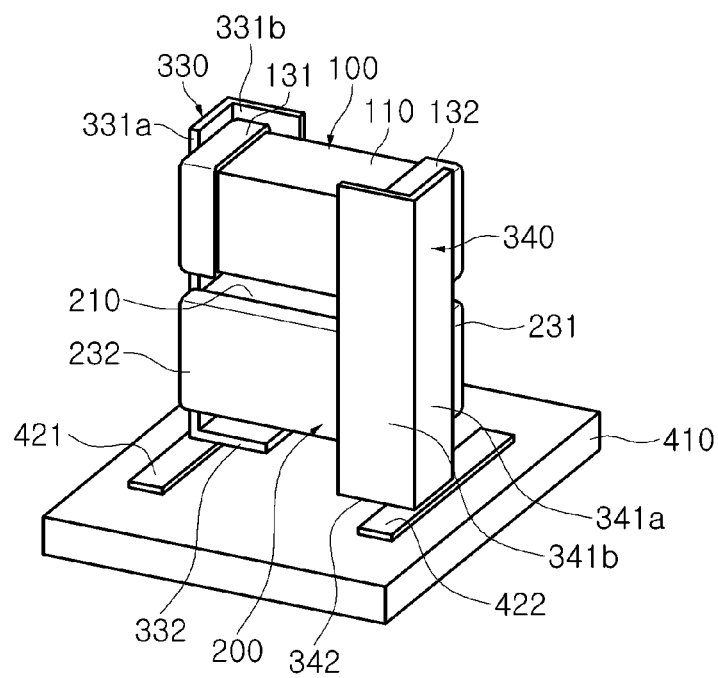
FIG. 6 is a perspective view illustrating a schematic structure of a stacked-type MLCC module according to another embodiment of the present invention.

FIG. 6 is a perspective view illustrating a schematic structure of a stacked-type MLCC module according to another embodiment of the present invention.

Here, structures of the first ceramic body 100 positioned upwardly and the PCB 410 are similar to those of the former embodiment as described above, so a detailed description thereof will be omitted in order to avoid redundancy, and only the different structures of the second ceramic body 200 positioned in a lower portion and the first and second metal frames 330 and 340 will be described in detail.

The second ceramic body 200 has a structure similar to that of the first ceramic body 100 and different in that first and second internal electrodes are alternately exposed to both lateral surfaces of the ceramic element 210 in a lamination direction of the dielectric layers 111 and the first and second external electrodes 231 and 232 are formed on both lateral surfaces of the ceramic element 210.

The first and second metal frames 330 and 340 may be disposed in corner portions of the first and second ceramic bodies 100 and 200 opposing diagonally.

External electrode adhesion surfaces of the first and second metal frames 330 and 340 may include first unit frames 331b and 341b having flat surfaces in a length direction of the first ceramic body 100 and second unit frames 331a and 341a connected to the first unit frames 331b and 341b and having flat surfaces in a width direction of the first ceramic body 100.

Namely, the first and second metal frames 330 and 340 may have two adhesion surfaces 331a, 331b, 341a, and 341b formed to be bent in an 'L' shape, respectively, whereby the first and second external electrodes 231 and 232 of the second ceramic body 200 positioned in the lower portion and the first and second external electrodes 131 and 132 of the first ceramic body 100 positioned in the upper portion can be simultaneously electrically connected.

Here, connection terminal plates 332 and 342 may be formed to be bent by 90° inwardly from lower end portions of the first and second metal frames 330 and 340 in order to increase a surface in contact with first and second electrode pads 421 and 422 of the printed circuit board (PCB) 410, to enhance reliability of electrical connection.

Figure 7A:
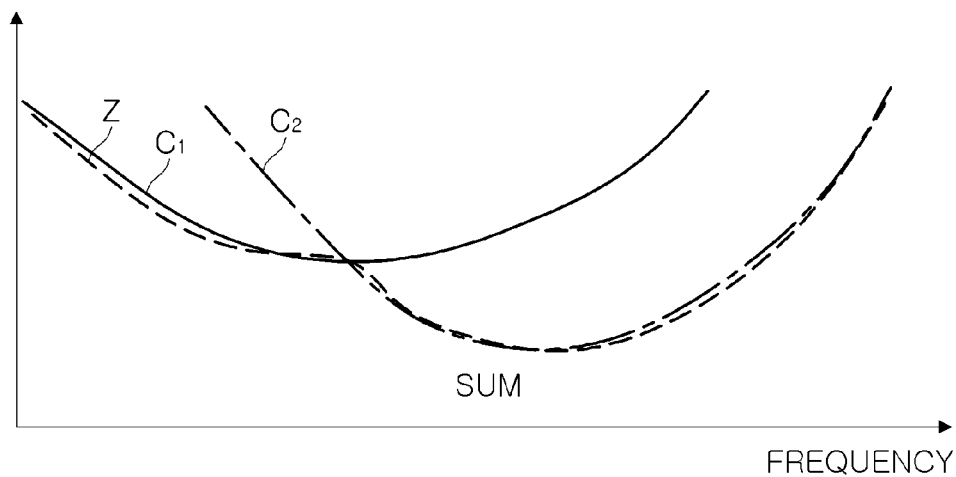
FIG. 7A is a graph showing a relationship between frequency and impedance in a structure in which two ceramic bodies are mounted to be vertically parallel on a PCB, capacitance of a lower ceramic body is lower than capacitance of an upper ceramic body, and inductance of the lower ceramic body is lower than inductance of the upper ceramic body according to another embodiment of the present invention.

FIG. 7A is a graph showing a relationship between frequency and impedance in a structure in which two ceramic bodies are mounted to be vertically parallel on a PCB, capacitance of a lower ceramic body is lower than capacitance of an upper ceramic body, and inductance of the lower ceramic body is lower than inductance of the upper ceramic body according to another embodiment of the present invention.

Here, C1 denotes capacitance of the upper ceramic body, and C2 denotes capacitance of the lower ceramic body.

Referring to FIG. 7A, in comparison with the former embodiment, when the ceramic body 200 having low capacitance and low inductance is disposed in the lower portion, impedance is reduced in a high frequency range, whereby impedance can be controlled within a broader frequency range, thus obtaining an effect of canceling out an increase in parasitic inductance, while restraining an occurrence of cracks and vibrations (acoustic noise) when a voltage is applied after the MLCCs are mounted on the PCB.

Figure 7B:
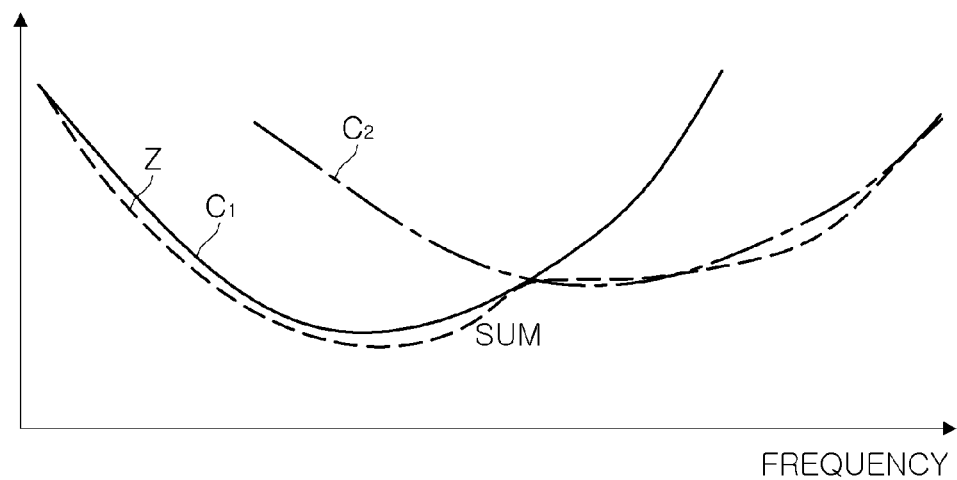
FIG. 7B is a graph showing a relationship between frequency and impedance in a structure in which two ceramic bodies are mounted to be vertically parallel on a PCB, capacitance of a lower ceramic body is greater than capacitance of an upper ceramic body, and inductance of the lower ceramic body is lower than inductance of the upper ceramic body according to another embodiment of the present invention.

FIG. 7B is a graph showing a relationship between frequency and impedance in a structure in which two ceramic bodies are mounted to be vertically parallel on a PCB, capacitance of a lower ceramic body is greater than capacitance of an upper ceramic body, and inductance of the lower ceramic body is lower than inductance of the upper ceramic body according to another embodiment of the present invention.

Here, C1 denotes capacitance of the upper ceramic body, and C2 denotes capacitance of the lower ceramic body.

Referring to FIG. 7B, in comparison to the former embodiment, when the ceramic body 200 having high capacitance and low inductance is disposed in the lower portion, impedance is reduced in a high frequency range, whereby impedance can be controlled within a broader frequency range, thus obtaining an effect of canceling out an increase in parasitic inductance, while restraining an occurrence of cracks and vibrations (acoustic noise) when a voltage is applied after the MLCCs are mounted on the PCB.

Hereinafter, a method for manufacturing a stacked-type MLCC according to an embodiment of the present invention will be described.

First, a plurality of first and second ceramic sheets are prepared. The first and second ceramic sheets, serving to form the dielectric layers 111 of the ceramic element 110, may be fabricated by mixing a ceramic additive, an organic solvent, a plasticizer, a binder, and a dispersing agent with ceramic powder, and processing the mixture with a basket mill to prepare a slurry and processing the slurry into sheets having a thickness of a few µm through a method such as a doctor blade process, or the like.

The ceramic powder may include barium titanate (BaTiO$_3$). However, the present invention is not limited thereto and the ceramic powder may include $(Ba_{1-x}Ca_x)TiO_3$, $Ba(Ti_{1-y}Ca_y)O_3$, $(Ba_{1-x}Ca_x)(Ti_{1-y}Zr_y)O_3$, $Ba(Ti_{1-y}Zr_y)O_3$, or the like, obtained by adding calcium (Ca), zirconium (Zr), or the like, to barium titanate (BaTiO$_3$).

Next, a conductive paste is printed to have a predetermined thickness on one surfaces of the first and second ceramic sheets to form the first and second internal electrodes 121 and 122. Here, the first internal electrode 121 may be formed to be exposed to one end surface of a first ceramic sheet, and the second internal electrode 122 may be formed to be exposed to the other end surface of a second ceramic sheet in a direction opposite the direction of the first internal electrode 121.

Also, as the method of printing the conductive paste, a screen printing method, a gravure printing method, or the like, may be used, but the present invention is not limited thereto.

The conductive paste may be printed by using a screen printing method, a gravure printing method, or the like. The conductive paste may include metal powder, ceramic powder, silica (SiO$_2$) powder, and the like.

The metal powder may be a precious metal such as silver (Ag), lead (Pb), platinum (Pt), or the like, and nickel (Ni), manganese (Mn), chromium (Cr), cobalt (Co), aluminum (Al), and copper (Cu), or an alloy thereof.

Thereafter, a plurality of first and second ceramic sheets are laminated, and the laminated first and second ceramic sheets and the first and second internal electrodes 121 and 122 are pressed in the lamination direction so as to be compressed. Accordingly, a ceramic laminate having a structure in which the plurality of dielectric layers 111 and the plurality of first and second internal electrodes 121 and 122 are alternately laminated is configured.

Thereafter, regions corresponding to respective MLCCs of the laminate are cut to form chips. Here, the MLCCs may be cut such that one ends of the first and second internal electrodes 121 and 122 are alternately exposed to both end surfaces thereof.

Thereafter, the severed chip is calcined and fired at a high temperature and subsequently ground to complete the ceramic element 110 having the first and second internal electrodes 121 and 122 alternately laminated therein Thereafter, the first and second external electrodes 131 and 132 are formed on both end surfaces of the ceramic element 110 to cover exposed portions of the first and second internal electrodes 121 and 122 so as to be electrically connected thereto, completing the upper ceramic body 100.

Meanwhile, the lower ceramic body 200 has a structure similar to that of the upper ceramic body 100. Compared to the upper ceramic body 100, the lower ceramic body 200 is configured to have a different amount of laminated first and second internal electrodes such that an area of overlap regions of the first and second internal electrodes is different from that of the upper ceramic body 100 so as to have a different level of capacitance from that of the upper ceramic body 100.

Thereafter, the flat plate type first and second metal frames 310 and 320 are disposed to face one another in parallel, and the upper and lower ceramic bodies 100 and 200 are disposed in a length direction of the first and second metal frames 310 and 320 between the first and second metal frames 310 and 320 with an interval therebetween. Thereafter, the first and second external electrodes 131, 231, 132, and 232 formed on the respective ceramic bodies 100 and 200 are attached to the first and second metal frames 310 and 320 to complete stacked-type MLCCs.

Thereafter, the connection terminal plates 312 and 322 formed on lower end portions of the first and second metal frames 310 and 320 are attached to the first and second electrode pads 421 and 422 provided on an upper surface of the PCB 410 by solders so as to be electrically connected thereto, thus finally completing a stacked-type multilayer ceramic electronic component module.

Meanwhile, a case of using a stacked-type MLCC according to another embodiment of the present invention will hereinafter be described.

According to another embodiment of the present invention, in the second ceramic body 200 as a lower ceramic body, the first and second internal electrodes are alternately exposed to lateral surfaces of the ceramic element 210 opposing one another and the first and second external electrodes 231 and 232 are formed on both lateral surfaces of the ceramic element 210 so as to be electrically connected to exposed portions of the first and second internal electrodes.

Also, the first and second external electrodes 231 and 232 of the second ceramic body 200 face forwardly and backwardly and the first and second external electrodes 131 and 132 face laterally, and the second ceramic body 200 and the first ceramic body 100 are attached in order of the second ceramic body 200 and the first ceramic body 100 from below to the first and second metal frames 330 and 340 at a vertical interval.

The first and second metal frames 330 and 340 may be disposed in corner portions of the first and second ceramic bodies 100 and 200 opposing one another diagonally.

Also, external electrode adhesion surfaces of the first and second metal frames 330 and 340 may have two adhesion surfaces 331a, 331b, 341a, and 341b formed to be bent in an 'L' shape, respectively, whereby the first and second external electrodes 231 and 232 of the second ceramic body 200 positioned in the lower portion and the first and second external electrodes 131 and 132 of the first ceramic body 100 positioned in the upper portion can be simultaneously electrically connected.

As set forth above, according to embodiments of the invention, two or more multilayer ceramic electronic components are disposed in vertically parallel in a board mounting structure using metal frames made of a conductive material and the multilayer ceramic electronic components are configured to have different capacitance values. Thus, after the multilayer ceramic electronic components are mounted, when a voltage is applied thereto, an increase in parasitic inductance can be canceled out, while an occurrence of cracks and vibrations (acoustic noise) is restrained.

While the present invention has been shown and described in connection with the embodiments, it will be apparent to those skilled in the art that modifications and variations can be made without departing from the spirit and scope of the invention as defined by the appended claims.

What is claimed is:

1. A stacked-type multilayer ceramic electronic component comprising:
    a ceramic body including a ceramic element in which a plurality of dielectric layers are laminated, a plurality of first and second internal electrodes formed on one surfaces of the dielectric layers and alternately exposed to both surfaces of the ceramic element opposing one another in a lamination direction of the dielectric layers, and first and second external electrodes formed on both surfaces of the ceramic element opposing one another and electrically connected to exposed portions of the first and second internal electrodes; and
    first and second metal frames disposed to face one another and allowing the first and second external electrodes of the ceramic body to be attached thereto, respectively,
    wherein two or more ceramic bodies are attached between the first and second metal frames in a length direction of the first and second metal frames with an interval therebetween, and the respective ceramic bodies have different levels of capacitance.

2. The stacked-type multilayer ceramic electronic component of claim 1, wherein two ceramic bodies are provided,
    first and second internal electrodes of the respective ceramic bodies are alternately exposed to both end surfaces of the ceramic bodies,
    first and second external electrodes are formed on both end surfaces of the ceramic bodies, respectively, and
    the first and second metal frames are disposed to contact both end surfaces of the respective ceramic bodies.

3. The stacked-type multilayer ceramic electronic component of claim 2, wherein the first and second metal frames are formed as flat plate type frames in parallel, such that external electrode adhesion surfaces thereof face one another.

4. The stacked-type multilayer ceramic electronic component of claim 1, wherein two first and second ceramic bodies are provided,
    first and second internal electrodes of the first ceramic body are alternately exposed to both end surfaces of the ceramic element and first and second external electrodes of the first ceramic body are formed on both end surfaces of the ceramic element,
    first and second internal electrodes of the second ceramic body are alternately exposed to both lateral surfaces of the ceramic element and first and second external electrodes of the second ceramic body are formed on both lateral surfaces of the ceramic element,
    the first and second ceramic bodies are attached between the first and second metal frames with an interval therebetween such that directions in which the first and second external electrodes of the respective first and second ceramic bodies are formed intersect vertically, and
    the first and second metal frames are disposed in corner portions of the first and second ceramic bodies opposing diagonally.

5. The stacked-type multilayer ceramic electronic component of claim 4, wherein external electrode adhesion surfaces of the first and second metal frames comprise a first unit frame connected to the vertically intersecting first and second external electrodes of the first and second ceramic bodies and having a flat surface in a length direction of the first ceramic body, and a second unit frame connected to the first unit frame and having a flat surface in a width direction of the first ceramic body, respectively.

6. A stacked-type multilayer ceramic electronic component module comprising:
    a printed circuit board (PCB) having first and second electrode pads formed on an upper surface thereof;
    first and second metal frames installed on the first and second electrode pads and electrically connected thereto, respectively; and
    two or more ceramic bodies are attached between the first and second metal frames in a length direction of the first and second metal frames with an interval therebetween,
    wherein each of the ceramic bodies includes a ceramic element in which a plurality of dielectric layers are laminated, a plurality of first and second internal electrodes formed on one surfaces of the dielectric layers and alternately exposed to both surfaces of the ceramic element opposing one another in a lamination direction of the dielectric layers, and first and second external electrodes formed on both surfaces of the ceramic element opposing one another, electrically connected to exposed portions of the first and second internal electrodes, and attached to the first and second metal frames, respectively,
    wherein the respective ceramic bodies have different levels of capacitance.

7. The stacked-type multilayer ceramic electronic component module of claim 6, wherein connection terminal plates are provided on lower ends of the first and second metal frames in order to extend surface in contact with the first and second electrode pads.

8. The stacked-type multilayer ceramic electronic component module of claim 6, wherein two ceramic bodies are provided,
    first and second internal electrodes of the respective ceramic bodies are alternately exposed to both end surfaces of the ceramic bodies,
    first and second external electrodes are formed on both end surfaces of the ceramic bodies, respectively, and
    the first and second metal frames are disposed to contact both end surfaces of the respective ceramic bodies.

9. The stacked-type multilayer ceramic electronic component module of claim 8, wherein the first and second metal frames are formed as flat plate type frames in parallel, such that external electrode adhesion surfaces thereof face one another.

10. The stacked-type multilayer ceramic electronic component module of claim 6, wherein an inductance value of a ceramic body positioned to be close to the PCB is lower than an inductance value of a ceramic body positioned to be distant from the PCB.

11. The stacked-type multilayer ceramic electronic component module of claim 10, wherein two first and second ceramic bodies are provided,
    first and second internal electrodes of the first ceramic body are alternately exposed to both end surfaces of the ceramic element and first and second external electrodes of the first ceramic body are formed on both end surfaces of the ceramic element, first and second internal electrodes of the second ceramic body are alternately exposed to both lateral surfaces of the ceramic element and first and second external electrodes of the second ceramic body are formed on both lateral surfaces of the ceramic element, the first and second ceramic bodies are attached between the first and second metal frames with an interval therebetween such that directions in which the first and second external electrodes of the respective first and second ceramic bodies are formed intersect vertically, and the first and second metal frames are disposed in corner portions of the first and second ceramic bodies opposing diagonally.

12. The stacked-type multilayer ceramic electronic component module of claim 11, wherein external electrode adhesion surfaces of the first and second metal frames comprise a first unit frame connected to the vertically intersecting first and second external electrodes of the first and second ceramic bodies and having a flat surface in a length direction of the first ceramic body, and a second unit frame connected to the first unit frame and having a flat surface in a width direction of the first ceramic body, respectively.

13. A method for manufacturing a stacked-type multilayer ceramic electronic component module, the method comprising:

preparing a plurality of ceramic elements having a plurality of dielectric layers and a plurality of internal electrodes alternately exposed to both end surfaces thereof opposing one another, the ceramic elements having different amounts of laminated internal electrodes to have different levels of capacitance;

forming first and second external electrodes electrically connected to the exposed portions of the internal electrodes on both end surfaces of the respective ceramic elements to prepare a plurality of ceramic bodies;

disposing first and second flat plate type metal frames such that they face one another in parallel, disposing the plurality of ceramic bodies between the first and second metal frames in a length direction of the first and second metal frames with an interval therebetween, and subsequently attaching the first and second external electrodes of the ceramic bodies to the first and second metal frames to fabricate stacked-type multilayer ceramic electronic components; and attaching lower end portions of the first and second metal frames to first and second electrode pads provided on a PCB by solders so as to be electrically connected thereto.

14. A method for manufacturing a stacked-type multilayer ceramic electronic component module, the method comprising:

preparing a first ceramic element having a plurality of dielectric layers and a plurality of internal electrodes alternately exposed to both end surfaces thereof opposing one another and a second ceramic element having a plurality of dielectric layers and a plurality of internal electrodes alternately exposed to both lateral surfaces thereof opposing one another, the first and second ceramic elements having different amounts of laminated internal electrodes to have different levels of capacitance;

forming first and second external electrodes electrically connected to the exposed portions of the internal electrodes on both end surfaces of the first ceramic element and forming first and second external electrodes electrically connected to the exposed portions of the internal electrodes on both lateral surfaces of the second ceramic element to prepare first and second ceramic bodies;

disposing first and second metal frames formed to be bent to have an 'L' shape such that they face one another diagonally, disposing the first and second ceramic bodies between the first and second metal frames in a length direction of the first and second metal frames with an interval therebetween, and subsequently attaching diagonally opposing portions of the first and second external electrodes of the first and second ceramic bodies to the bent portions of the first and second metal frames to fabricate stacked-type multilayer ceramic electronic components; and attaching lower end portions of the first and second metal frames to first and second electrode pads provided on a PCB by solders so as to be electrically connected thereto.

15. The method of claim 14, wherein in the electrically connecting of the first and second metal frames to the PCB, a direction in which the stacked-type multilayer ceramic electronic components are attached to the PCB is set such that the second ceramic body is positioned to be closer to the PCB.

* * * * *